United States Patent
Michishita

(10) Patent No.: US 7,479,773 B2
(45) Date of Patent: Jan. 20, 2009

(54) SYNCHRONOUS RECTIFICATION SWITCHING REGULATOR AND SWITCHING METHOD

(75) Inventor: Yuusuke Michishita, Ikeda (JP)

(73) Assignee: Ricoh Company, Ltd. (JP)

( * ) Notice: Subject to any disclaimer, the term of this patent is extended or adjusted under 35 U.S.C. 154(b) by 0 days.

(21) Appl. No.: 11/896,632

(22) Filed: Sep. 4, 2007

(65) Prior Publication Data
US 2008/0061755 A1 Mar. 13, 2008

(30) Foreign Application Priority Data
Sep. 7, 2006 (JP) ............... 2006-242613

(51) Int. Cl.
*G05F 1/613* (2006.01)
*G05F 1/00* (2006.01)
(52) U.S. Cl. .............. 323/282; 323/222; 323/223; 323/224; 323/284; 323/285
(58) Field of Classification Search .......... 323/222, 323/223, 224, 282, 284, 285
See application file for complete search history.

(56) References Cited

U.S. PATENT DOCUMENTS

| | | | | |
|---|---|---|---|---|
| 6,504,351 B2 * | 1/2003 | Eagar et al. | .................. | 323/282 |
| 7,061,218 B2 * | 6/2006 | Ito | .............................. | 323/351 |
| 7,166,993 B2 * | 1/2007 | Shimizu et al. | ............. | 323/282 |
| 7,292,018 B2 * | 11/2007 | Chen | ........................... | 323/282 |
| 2005/0077884 A1 * | 4/2005 | Krug et al. | ................... | 323/282 |
| 2006/0164057 A1 * | 7/2006 | Kudo et al. | ................. | 323/282 |
| 2006/0181260 A1 * | 8/2006 | Ito | .............................. | 323/315 |

FOREIGN PATENT DOCUMENTS

JP  2004-056982  2/2004

* cited by examiner

*Primary Examiner*—Bao Q Vu
(74) *Attorney, Agent, or Firm*—Dickstein Shapiro LLP

(57) ABSTRACT

A synchronous rectification switching regulator includes a reverse current prevention circuit unit that detects a symptom of a reverse current flowing in a direction from an output terminal to a second switching element or a generation of the reverse current based on a voltage of a connecting portion for connecting the second switching element with a third switching element. The reverse current prevention circuit unit turns off the third switching element to interrupt the reverse current when the reverse current prevention circuit unit detects the symptom or the generation of the reverse current.

10 Claims, 7 Drawing Sheets

SYNCHRONOUS RECTIFICATION SWITCHING REGULATOR AND SWITCHING METHOD

CROSS-REFERENCE TO RELATED APPLICATION

The present application is based on and claims priority from Japanese Patent Application No. 2006-242613 filed on Sep. 7, 2006 in the Japan Patent Office, the entire contents of which are hereby incorporated herein by reference.

BACKGROUND OF THE INVENTION

1. Field of the Invention

Exemplary aspects of the present invention relate to a synchronous rectification switching regulator and a switching method, and more particularly, to a synchronous rectification switching regulator and a switching method for quickly interrupting a reverse current after detection of the reverse current.

2. Description of the Related Art

A related-art switching regulator of synchronous rectification type includes a configuration for detecting and interrupting a reverse current. FIG. 1 illustrates a switching regulator 100 as one example of the related-art switching regulator of synchronous rectification type. The switching regulator 100 is a step-down switching regulator. In the switching regulator 100, when a small load is applied, a reverse current flows from an output terminal 104 to a ground voltage GND via an NMOS (N-channel metal oxide semiconductor) transistor QN1. To prevent generation of the reverse current, a detection circuit 131 quickly detects when a voltage of a junction K, which connects a PMOS (P-channel metal oxide semiconductor) transistor QP1 with the NMOS transistor QN1, undershoots the ground voltage GND and then increases to a level above the ground voltage GND again, at which time the detection circuit 131 quickly turns off the NMOS transistor QN1 to prevent generation of a reverse current and to reduce power consumption.

When the detection circuit 131 detects a reverse current, the detection circuit 131 turns off the NMOS transistor QN1 via an output driver 132. Therefore, a time-lag occurs between a detection of a reverse current and a turning-off of the NMOS transistor QN1. Specifically, the reverse current flows from the output terminal 104 through a coil L for a longer time period, resulting in decreased efficiency.

SUMMARY OF THE INVENTION

This specification describes a novel synchronous rectification switching regulator. In one aspect of the present invention, the novel synchronous rectification switching regulator includes an input terminal, an output terminal, a load, a first switching element, an inductor, a second switching element, a control circuit unit, a reverse current prevention circuit unit, and a connecting portion. The input terminal is configured to receive an input voltage. The output terminal is configured to output a predetermined output voltage obtained by converting the input voltage. The load is connected to the output terminal and is configured to receive the predetermined output voltage output by the output terminal. The first switching element is configured to perform a first switching. The inductor is charged with the input voltage by the first switching of the first switching element. The second switching element is for synchronous rectification and is configured to perform a second switching to discharge the inductor. The control circuit unit is configured to control the first switching element to perform the first switching and to control the second switching element to perform the second switching opposite to the first switching, so that the output terminal outputs the predetermined output voltage. The reverse current prevention circuit unit includes a third switching element connected to the second switching element in series. The connecting portion is configured to connect the second switching element with the third switching element. The reverse current prevention circuit unit detects a symptom of a reverse current flowing in a direction from the output terminal to the second switching element or a generation of the reverse current based on a voltage of the connecting portion. The reverse current prevention circuit unit turns off the third switching element to interrupt the reverse current when the reverse current prevention circuit unit detects the symptom or the generation of the reverse current.

This specification further describes a novel switching method. In one aspect of the present invention, the novel switching method includes inputting an input voltage to an input terminal, and connecting the input terminal with a load via an inductor and an output terminal. The method further includes charging the inductor with the input voltage, connecting a second switching element with a third switching element in series via a connecting portion, and detecting a symptom of a reverse current flowing in a direction from the output terminal to the second switching element or a generation of the reverse current based on a voltage of the connecting portion. The method further includes turning off the third switching element to interrupt the reverse current when the symptom or the generation of the reverse current is detected. The method further includes discharging the inductor by switching of the second switching element and outputting a predetermined output voltage to the load.

BRIEF DESCRIPTION OF THE DRAWINGS

A more complete appreciation of the invention and the many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
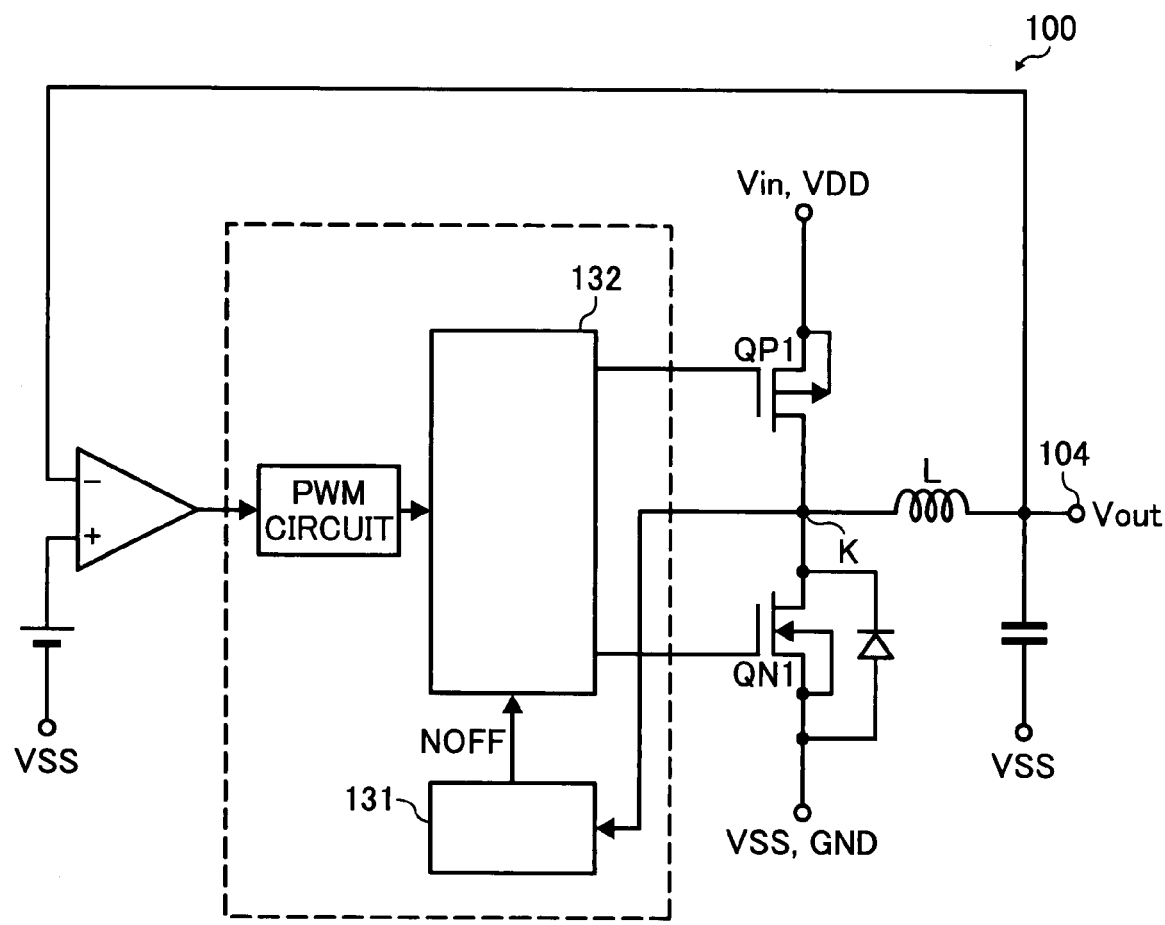
FIG. 1 is a circuit diagram of a related-art switching regulator.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner.

Figure 2:
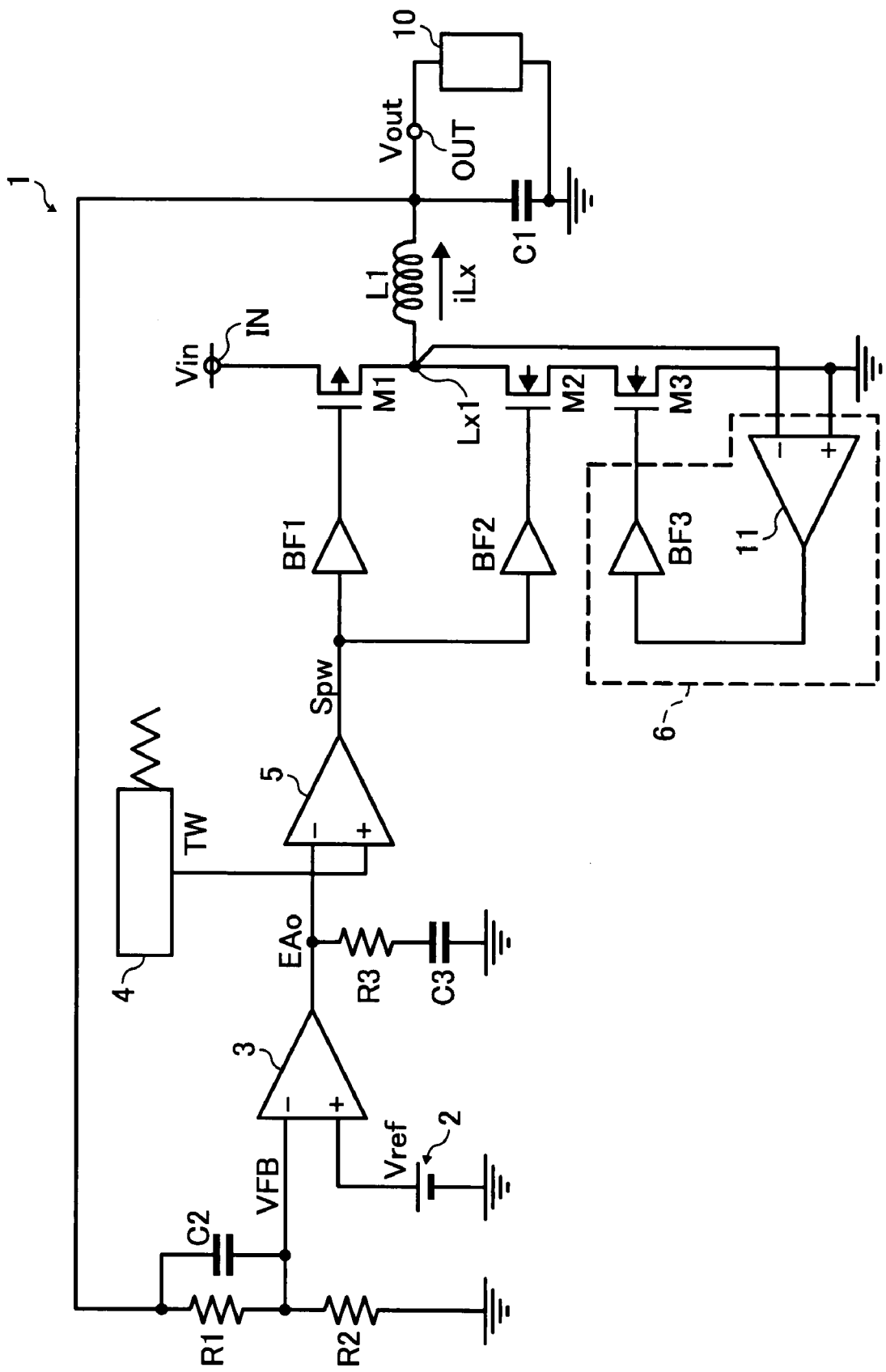
FIG. 2 is a circuit diagram of an example circuit of a switching regulator according to an exemplary embodiment of the present invention.

Referring now to the drawings, wherein like reference numerals designate identical or corresponding parts throughout the several views, particularly to FIG. 2, a switching regulator 1 according to an exemplary embodiment of the present invention is explained.

As illustrated in FIG. 2, the switching regulator 1 includes an input terminal IN, an output terminal OUT, a load 10, a first switching element M1, a second switching element M2, a reference voltage generating circuit 2, resistors R1, R2, and R3, an inductor L1, condensers C1, C2, and C3, an error amplifier circuit 3, an oscillator circuit 4, a PWM (pulse width modulation) comparator 5, buffers BF1 and BF2, a third switching element M3, a reverse current detection circuit 6, and a junction Lx1. The reverse current detection circuit 6 includes a comparator 11 and a buffer BF3.

The switching regulator 1 is a synchronous rectification-type switching regulator for converting an input voltage Vin input to the input terminal IN into an output voltage Vout having a predetermined constant voltage and outputting the output voltage Vout from the output terminal OUT to the load 10.

The first switching element M1 (e.g., a switching device) includes a transistor, such as a PMOS (P-channel metal oxide semiconductor) transistor, and performs a switching operation for controlling output of the input voltage Vin. The second switching element M2 (e.g., a switching device) includes a transistor, such as an NMOS (N-channel metal oxide semiconductor) transistor, and performs synchronous rectification.

The resistors R1 and R2 are used for detecting an output voltage. The condenser C1 is used for smoothing a voltage. The resistor R3 and the condensers C2 and C3 are used for phase compensation. The third switching element M3 (e.g., a switching device) includes a transistor, such as an NMOS transistor. In the switching regulator 1, the reference voltage generating circuit 2, the resistors R1, R2, and R3, the error amplifier circuit 3, the oscillator circuit 4, the PWM comparator 5, the buffers BF1 and BF2, and the condensers C2 and C3 serve as a control circuit unit. The third switching element M3 and the reverse current detection circuit 6 serve as a reverse current prevention circuit unit.

It should be noted that circuits other than the inductor L1 and the condenser C1 may be integrated into a single integrated circuit. Alternatively, at least one of the first switching element M1, the second switching element M2, and the third switching element M3 and circuits other than the inductor L1 and the condenser C1 may be integrated into a single integrated circuit.

The reference voltage generating circuit 2 generates a predetermined reference voltage Vref and outputs the reference voltage Vref to the error amplifier circuit 3. The resistors R1 and R2, which are used for detecting an output voltage, divide the output voltage Vout into a divided voltage VFB and output the divided voltage VFB to the error amplifier circuit 3. The error amplifier circuit 3 amplifies a voltage difference between the divided voltage VFB and the reference voltage Vref to generate and output an output signal EAo to the PWM comparator 5.

The oscillator circuit 4 generates and outputs a predetermined triangular wave signal TW to the PWM comparator 5. The PWM comparator 5 generates a pulse signal Spw for PWM control based on the output signal EAo and the triangular wave signal TW, and outputs the pulse signal Spw to the buffers BF1 and BF2. The pulse signal Spw enters a gate of the first switching element M1 via the buffer BF1 and a gate of the second switching element M2 via the buffer BF2. The reverse current detection circuit 6 detects a symptom of a reverse current generating in the second switching element M2. When the reverse current detection circuit 6 detects the symptom of the reverse current, the reverse current detection circuit 6 turns off the third switching element M3 to disconnect the second switching element M2 to a ground voltage. Thus, the reverse current is not generated in the second switching element M2.

The first switching element M1, the second switching element M2, and the third switching element M3 are connected in series at a position between the input terminal IN and the ground voltage. The second switching element M2 connects the first switching element M1 with the third switching element M3. One end of the third switching element M3 is connected to a ground voltage. The junction Lx1 (e.g., a connecting portion) is provided at a position between the first switching element M1 and the second switching element M2, and connects the first switching element M1 with the second switching element M2. The inductor L1 is provided at a position between the junction Lx1 and the output terminal OUT, and connects the junction Lx1 with the output terminal OUT. Specifically, the inductor L1 connects one end of the first switching element M1 with the output terminal OUT. The inductor L1 is charged with an input voltage Vin input to the input terminal IN and output from the input terminal IN by switching of the first switching element M1.

The resistors R1 and R2 are connected in series at a position between the output terminal OUT and a ground voltage. The condenser C2 is connected to the resistors R1 and R2. The divided voltage VFB is output from a junction for connecting the resistor R1 with the resistor R2. The resistor R1 and the condenser C2 for phase compensation are connected in parallel. In the error amplifier circuit 3, the divided voltage VFB is input to an inverted input terminal. The reference voltage Vref is input to a non-inverted input terminal. An output terminal is connected to an inverted input terminal of the PWM comparator 5.

A series circuit in which the resistor R3 and the condenser C3 are connected in series connects the output terminal of the error amplifier circuit 3 with a ground voltage. The series circuit forms a phase compensation circuit. The triangular wave signal TW is input to a non-inverted input terminal of the PWM comparator 5. The pulse signal Spw output from the PWM comparator 5 enters the gate of the first switching element M1 via the buffer BF1 and the gate of the second switching element M2 via the buffer BF2.

An inverted input terminal of the comparator 11 is connected to the junction Lx1. A non-inverted input terminal of the comparator 11 is connected to a ground voltage. An output terminal of the comparator 11 is connected to a gate of the third switching element M3 via the buffer BF3.

In the above-described configuration, when a voltage of the junction Lx1 is smaller than the ground voltage and there is no symptom, sign, or possibility of generation of a reverse current which flows from the junction Lx1 to the ground voltage, the comparator 11 outputs a high-level signal to turn on the third switching element M3 and bring the third switching element M3 into conduction.

When the output voltage Vout increases, a voltage of the output signal EAo output from the error amplifier circuit 3 decreases to decrease a duty cycle of the pulse signal Spw output from the PWM comparator 5. As a result, a time period when the first switching element M1 is turned on is decreased. Accordingly, a time period when the second switching element M2 is turned on is increased. Thus, the output voltage Vout is controlled to decrease.

When the output voltage Vout decreases, the voltage of the output signal EAo output from the error amplifier circuit 3 increases and the duty cycle of the pulse signal Spw output from the PWM comparator 5 increases. As a result, a time period when the first switching element M1 is turned on is increased. Accordingly, a time period when the second switching element M2 is turned on is decreased. Thus, the output voltage Vout is controlled to increase.

The above-described operations are repeated to control the output voltage Vout to have a predetermined constant voltage. When a voltage of the junction Lx1 is equivalent to the ground voltage and a symptom of a reverse current is detected or when a voltage of the junction Lx1 exceeds the ground voltage and a generation of a reverse current is detected, the comparator 11 outputs a low-level signal to turn off the third switching element M3 and interrupt the reverse current, while the second switching element M2 is turned on.

As described above, the reverse current detection circuit 6 detects whether or not there is a symptom of a reverse current flowing to the second switching element M2 based on the voltage of the junction Lx1. When the reverse current detection circuit 6 detects the symptom, the third switching element M3, which is connected to the second switching element M2 in series, is turned off to break connection between the second switching element M2 and the ground voltage. Thus, generation of the reverse current flowing to the second switching element M2 may be reliably prevented.

In addition, providing a circuit system that is separate from a control circuit unit for the second switching element M2 interrupts the reverse current flowing to the second switching element M2, thus enabling a time-lag between detection of generation of a reverse current and interruption of the reverse current to be shortened, resulting in increased efficiency and easy and efficient design of the switching regulator 1.

Although FIG. 2 illustrates the switching regulator 1 of voltage mode control type, the present invention is also applicable to a current mode control type of switching regulator, as described below with reference to FIG. 3.

Figure 3:
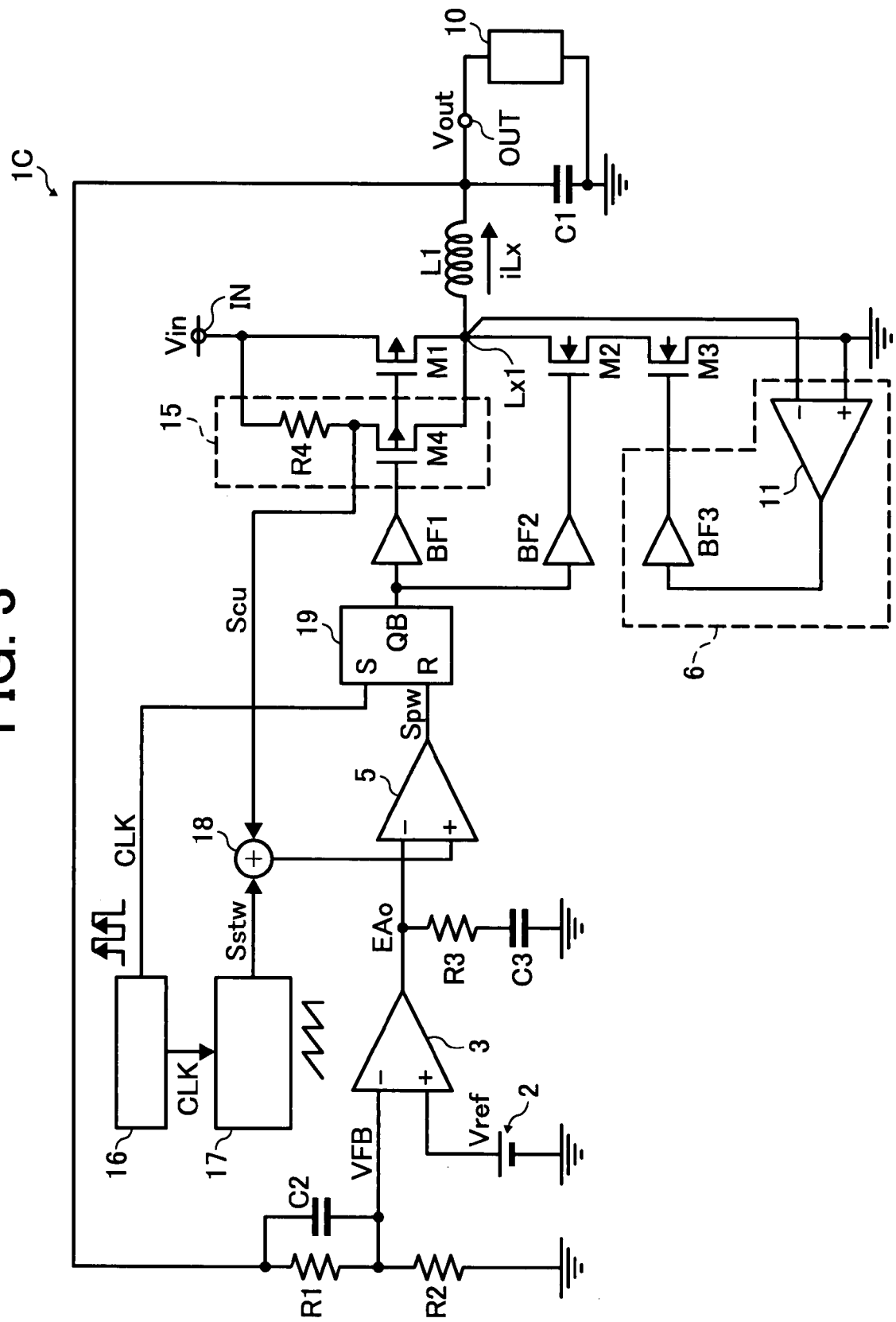
FIG. 3 is a circuit diagram of another example circuit of the switching regulator shown in FIG. 2.

Referring to FIG. 3, a description is now given of a switching regulator 1C of current mode control type according to another exemplary embodiment of the present invention.

The switching regulator 1C does not include the oscillator circuit 4 (depicted in FIG. 2), but does include a current detection circuit 15, an oscillator circuit 16, a slope compensation circuit 17, an adder circuit 18, and a flip-flop circuit 19. The current detection circuit 15 includes a resistor R4 and a fourth switching element M4. The other elements of the switching regulator 1C are common to the switching regulator 1 (depicted in FIG. 2). Specifically, the switching regulator 1C further includes the input terminal IN, the output terminal OUT, the load 10, the first switching element M1, the second switching element M2, the reference voltage generating circuit 2, the resistors R1, R2, and R3, the inductor L1, the condensers C1, C2, and C3, the error amplifier circuit 3, the PWM comparator 5, the buffers BF1 and BF2, the third switching element M3, and the reverse current detection circuit 6.

The switching regulator 1C is a synchronous rectification-type switching regulator for converting an input voltage Vin input to the input terminal IN into an output voltage Vout having a predetermined constant voltage and outputting the output voltage Vout from the output terminal OUT to the load 10.

The second switching element M2 performs synchronous rectification. The resistors R1 and R2 are used for detecting an output voltage. The condenser C1 is used for smoothing a voltage. The resistor R3 and the condensers C2 and C3 are used for phase compensation. The oscillator circuit 16 generates and outputs a clock signal CLK having a predetermined square wave. The slope compensation circuit 17 generates and outputs a predetermined sawtooth wave signal Sstw based on the clock signal CLK.

In the current detection circuit 15, the resistor R4 and the fourth switching element M4 form a series circuit. The fourth switching element M4 includes a MOS (metal oxide semiconductor) transistor, that is, a PMOS transistor, which is common to the first switching element M1.

In the switching regulator 1C, the reference voltage generating circuit 2, the resistors R1, R2, and R3, the error amplifier circuit 3, the oscillator circuit 16, the PWM comparator 5, the buffers BF1 and BF2, and the condensers C2 and C3, the current detection circuit 15, the slope compensation circuit 17, the adder circuit 18, and the flip-flop circuit 19 serve as a control circuit unit.

The clock signal CLK output from the oscillator circuit 16 enters the slope compensation circuit 17 and a set input terminal S of the flip-flop circuit 19. The slope compensation circuit 17 generates a sawtooth wave signal Sstw based on the clock signal CLK output from the oscillator circuit 16, and outputs the sawtooth wave signal Sstw to the adder circuit 18. The series circuit, which is formed by the resistor R4 and the fourth switching element M4, and the first switching element M1 are connected in parallel. A gate of the fourth switching element M4 is connected to the gate of the first switching element M1. The fourth switching element M4 is turned on and off in synchrony with the first switching element M1. A current proportional to a current output from the first switching element M1 flows through the resistor R4. The resistor R4 converts the current into a voltage. A junction, which connects the resistor R4 with the fourth switching element M4, outputs a voltage as a signal Scu to the adder circuit 18.

The adder circuit 18 adds the signal Scu to the sawtooth wave signal Sstw, and outputs the added signal to the non-inverted input terminal of the PWM comparator 5. The PWM comparator 5 generates a pulse signal Spw for PWM control based on an output signal EAo output from the error amplifier circuit 3 and the signal output from the adder circuit 18, and outputs the pulse signal Spw to a reset input terminal R of the flip-flop circuit 19. An output terminal QB of the flip-flop circuit 19 is connected to the gate of the first switching element M1 and the gate of the fourth switching element M4 via the buffer BF1. The output terminal QB is connected to the gate of the second switching element M2 via the buffer BF2.

The clock signal CLK enters the set input terminal S of the flip-flop circuit 19. The flip-flop circuit 19 is set by rise or fall of the clock signal CLK to cause the output terminal QB to output a low-level voltage. An output terminal of the PWM comparator 5 is connected to the reset input terminal R of the flip-flop circuit 19. The flip-flop circuit 19, after being set, is reset by the pulse signal Spw output from the PWM comparator 5 to cause the output terminal QB to output a high-level voltage. A signal output from the output terminal QB of the flip-flop circuit 19 enters the gate of the first switching element M1 and the gate of the fourth switching element M4 via the buffer BF1, and the gate of the second switching element M2 via the buffer BF2. The reverse current detection circuit 6 operates as described above with reference to FIG. 2. Thus, the switching regulator 1C of current mode control type may provide effects similar to those of the switching regulator 1 (depicted in FIG. 2) of voltage mode control type.

As illustrated in FIGS. 2 and 3, the third switching element M3 is provided at a position between the second switching element M2 and the ground voltage, and connects the second switching element M2 with the ground voltage. Alternatively, however, the third switching element M3 may be provided at a position between the junction Lx1 and the second switching element M2, and may connect the junction Lx1 with the second switching element M2.

Although FIGS. 2 and 3 illustrate the switching regulators 1 and 1C of step-down type, respectively, it should be noted that the present invention is also applicable to a switching regulator of step-up type, as described below with reference to FIG. 4.

Figure 4:
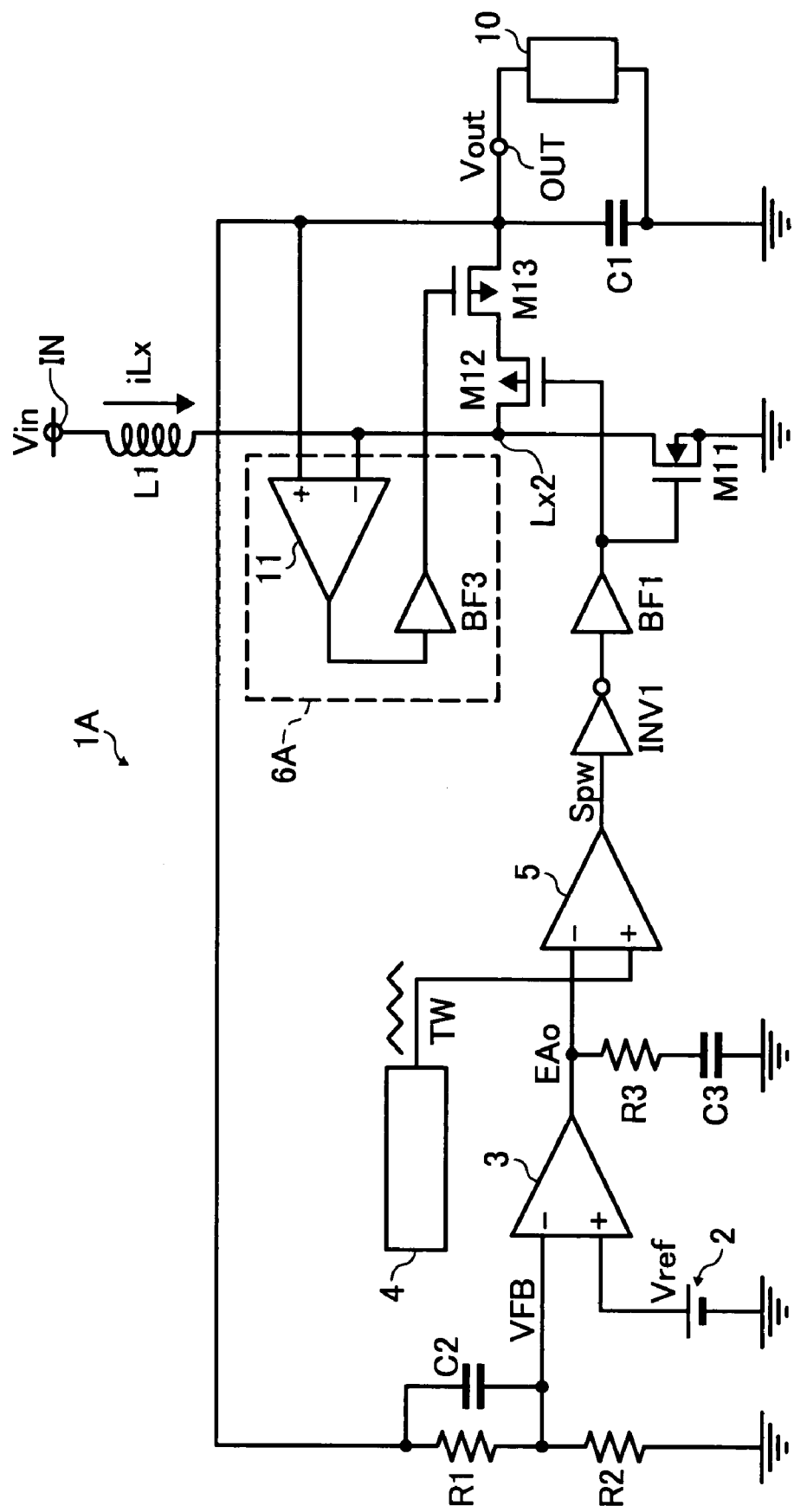
FIG. 4 is a circuit diagram of an example circuit of a switching regulator according to another exemplary embodiment of the present invention.

Referring to FIG. 4, the following describes a switching regulator 1A of step-up type according to yet another exemplary embodiment. The switching regulator 1A includes a first switching element M11, a second switching element M12, an inverter INV1, a third switching element M13, a reverse current detection circuit 6A, and a junction Lx2. The reverse current detection circuit 6A includes the comparator 11 and the buffer BF3. The other elements of the switching regulator 1A are common to the switching regulator 1 (depicted in FIG. 2). Specifically, the switching regulator 1A further includes the input terminal IN, the output terminal OUT, the load 10, the reference voltage generating circuit 2, the resistors R1, R2, and R3, the inductor L1, the condensers C1, C2, and C3, the error amplifier circuit 3, the oscillator circuit 4, the PWM comparator 5, and the buffer BF1.

The switching regulator 1A is a synchronous rectification-type switching regulator for converting an input voltage Vin input to the input terminal IN into an output voltage Vout having a predetermined constant voltage and outputting the output voltage Vout from the output terminal OUT to the load 10.

The first switching element M11 (e.g., a switching device) includes a transistor, such as an NMOS transistor, and performs a switching operation to control output of an input voltage Vin. The second switching element M12 (e.g., a switching device) includes a transistor, such as a PMOS transistor, and performs synchronous rectification. The resistors R1 and R2 are used for detecting an output voltage. The condenser C1 is used for smoothing a voltage. The resistor R3 and the condensers C2 and C3 are used for phase compensation. The third switching element M13 (e.g., a switching device) includes a transistor, such as a PMOS transistor.

In the switching regulator 1A, the reference voltage generating circuit 2, the resistors R1, R2, and R3, the error amplifier circuit 3, the oscillator circuit 4, the PWM comparator 5, the buffer BF1, the inverter INV1, and the condensers C2 and C3 serve as a control circuit unit. The third switching element M13 and the reverse current detection circuit 6A serve as a reverse current prevention circuit unit. Circuits other than the inductor L1 and the condenser C1 may be integrated into a single integrated circuit. Alternatively, at least one of the first switching element M11, the second switching element M12, and the third switching element M13 and circuits other than the inductor L1 and the condenser C1 may be integrated into a single integrated circuit.

The buffer BF1 outputs a pulse signal Spw input from the PWM comparator 5 via the inverter INV1 to a gate of the first switching element M11 and a gate of the second switching element M12. The reverse current detection circuit 6A breaks connection between the second switching element M12 and the output terminal OUT to prevent generation of a reverse current.

The inductor L1 and the first switching element M11 are connected in series at a position between the input terminal IN and a ground voltage. The junction Lx2 (e.g., a connecting portion) connects the inductor L1 with the first switching element M11. The second switching element M12 and the third switching element M13 are connected in series at a position between the junction Lx2 and the output terminal OUT. The inverted input terminal of the comparator 11 is connected to the junction Lx2. The non-inverted input terminal of the comparator 11 is connected to the output terminal OUT. The output terminal of the comparator 11 is connected to a gate of the third switching element M13 via the buffer BF3.

In the above-described configuration, when a voltage of the junction Lx2 exceeds an output voltage Vout and there is no symptom of a reverse current which flows from the output terminal OUT to the junction Lx2, the comparator 11 outputs a low-level signal to turn on the third switching element M13 and bring the third switching element M3 into conduction. When the output voltage Vout increases, a voltage of an output signal EAo output from the error amplifier circuit 3 decreases to decrease a duty cycle of the pulse signal Spw output from the PWM comparator 5. As a result, a time period when the first switching element M11 is turned on is increased. Accordingly, a time period when the second switching element M12 is turned on is decreased. Thus, the output voltage Vout is controlled to decrease.

When the output voltage Vout decreases, the voltage of the output signal EAo output from the error amplifier circuit 3 increases and the duty cycle of the pulse signal Spw output from the PWM comparator 5 increases. As a result, a time period when the first switching element M11 is turned on is decreased. Accordingly, a time period when the second switching element M12 is turned on is increased. Thus, the output voltage Vout is controlled to increase. The above-described operations are repeated to control the output voltage Vout to have a predetermined constant voltage.

When a voltage of the junction Lx2 is equivalent to the output voltage Vout and a symptom of a reverse current is detected or when a voltage of the junction Lx2 is smaller than the output voltage Vout and a generation of a reverse current is detected, the comparator 11 outputs a high-level signal to turn off the third switching element M13 and interrupt the reverse current, while the second switching element M12 is turned on.

As described above, the reverse current detection circuit 6A detects whether or not there is a symptom of a reverse current flowing to the second switching element M12 based on the voltage of the junction Lx2. When the reverse current detection circuit 6A detects the symptom, the third switching element M13, which is connected to the second switching element M12 in series, is turned off to break connection between the second switching element M12 and the output terminal OUT. Thus, generation of the reverse current flowing to the second switching element M12 may be reliably prevented. In addition, providing a circuit separate from a control circuit system for the second switching element M12 interrupts the reverse current flowing to the second switching element M12, thus enabling a time-lag between detection of generation of a reverse current and interruption of the reverse current to be shortened, resulting in increased efficiency and easy and efficient design of the switching regulator 1A.

Although FIG. 4 illustrates the switching regulator 1A of voltage mode control type, the present invention is also applicable to a switching regulator of current mode control type, as described below with reference to FIG. 5.

Figure 5:
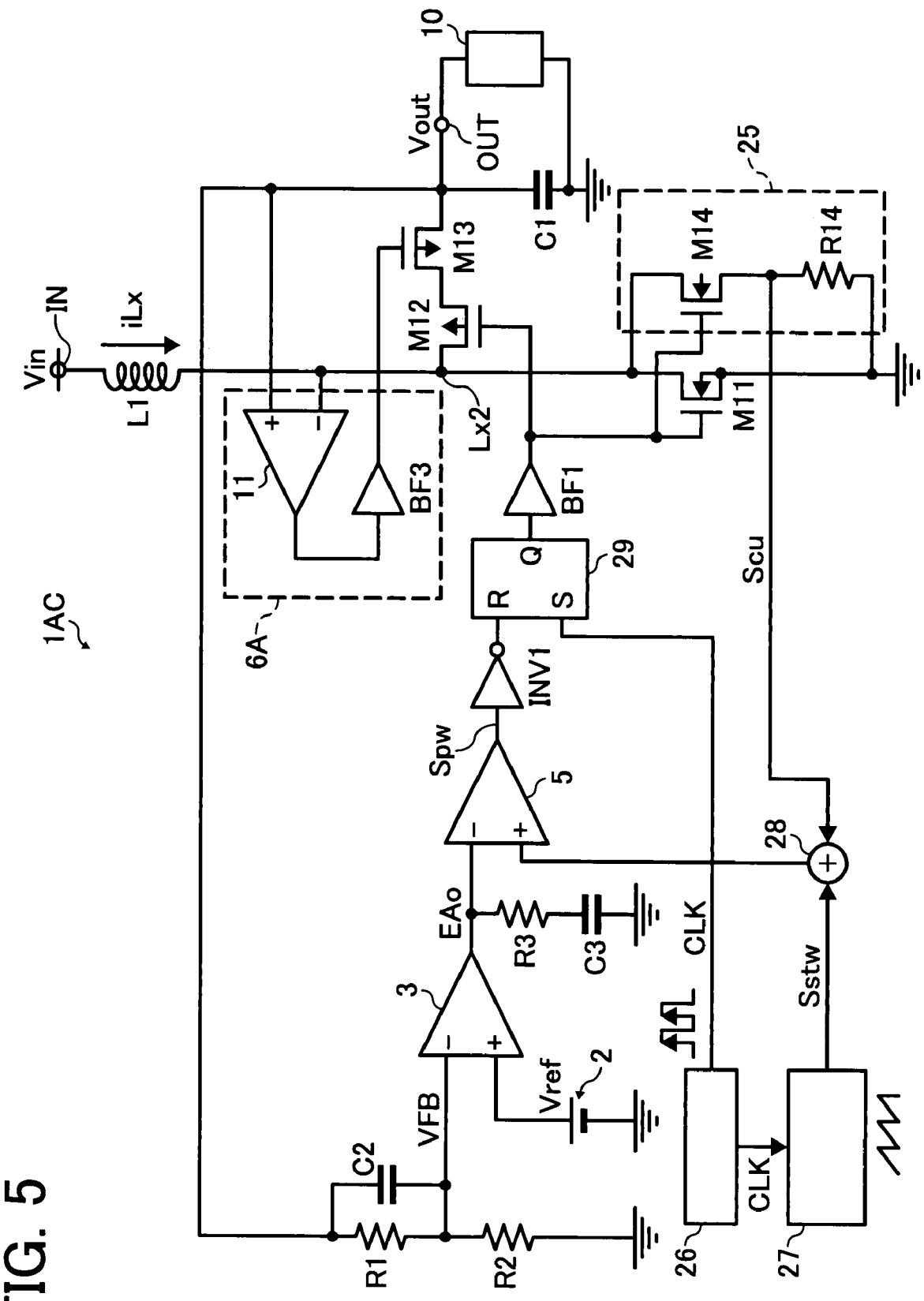
FIG. 5 is a circuit diagram of another example circuit of the switching regulator shown in FIG. 4.

Referring to FIG. 5, the following describes a switching regulator 1AC of current mode control type according to yet another exemplary embodiment. The switching regulator 1AC does not include the oscillator circuit 4 (depicted in FIG. 4), but does include a current detection circuit 25, an oscillator circuit 26, a slope compensation circuit 27, an adder circuit 28, and a flip-flop circuit 29. The current detection circuit 25 includes a resistor R14 and a fourth switching element M14. The other elements of the switching regulator 1AC are common to the switching regulator 1A (depicted in FIG. 4). Specifically, the switching regulator 1AC further includes the input terminal IN, the output terminal OUT, the load 10, the first switching element M11, the second switching element M12, the third switching element M13, the junction Lx2, the reference voltage generating circuit 2, the resistors R1, R2, and R3, the inductor L1, the condensers C1, C2, and C3, the error amplifier circuit 3, the PWM comparator 5, the buffer BF1, the inverter INV1, and the reverse current detection circuit 6A.

The switching regulator 1AC is a synchronous rectification-type switching regulator for converting an input voltage Vin input to the input terminal IN into an output voltage Vout having a predetermined constant voltage and outputting the output voltage Vout from the output terminal OUT to the load 10.

The second switching element M12 performs synchronous rectification. The resistors R1 and R2 are used for detecting an output voltage. The condenser C1 is used for smoothing a voltage. The resistor R3 and the condensers C2 and C3 are used for phase compensation. The oscillator circuit 26 generates and outputs a clock signal CLK having a predetermined square wave. The slope compensation circuit 27 generates and outputs a predetermined sawtooth wave signal Sstw based on the clock signal CLK.

In the current detection circuit 25, the resistor R14 and the fourth switching element M14 form a series circuit. The fourth switching element M14 (e.g., a switching device) includes a MOS transistor, that is, an NMOS transistor, which is common to the first switching element M11.

In the switching regulator 1AC, the reference voltage generating circuit 2, the resistors R1, R2, and R3, the error amplifier circuit 3, the oscillator circuit 26, the PWM comparator 5, the buffer BF1, the inverter INV1, and the condensers C2 and C3, the current detection circuit 25, the slope compensation circuit 27, the adder circuit 28, and the flip-flop circuit 29 serve as a control circuit unit.

The clock signal CLK output from the oscillator circuit 26 enters the slope compensation circuit 27 and a set input terminal S of the flip-flop circuit 29. The slope compensation circuit 27 generates a sawtooth wave signal Sstw based on the clock signal CLK output from the oscillator circuit 26, and outputs the sawtooth wave signal Sstw to the adder circuit 28. The series circuit, which is formed by the resistor R14 and the fourth switching element M14, and the first switching element M11 are connected in parallel. A gate of the fourth switching element M14 is connected to the gate of the first switching element M11. The fourth switching element M14 is turned on and off in synchrony with the first switching element M11. A current proportional to a current output from the first switching element M11 flows through the resistor R14. The resistor R14 converts the current into a voltage. A junction, which connects the resistor R14 with the fourth switching element M14, outputs a voltage as a signal Scu to the adder circuit 28.

The adder circuit 28 adds the signal Scu to the sawtooth wave signal Sstw, and outputs the added signal to the non-inverted input terminal of the PWM comparator 5. The PWM comparator 5 generates a pulse signal Spw for PWM control based on an output signal EAo output from the error amplifier circuit 3 and the signal output from the adder circuit 28, and outputs the pulse signal Spw to a reset input terminal R of the flip-flop circuit 29 via the inverter INV1. An output terminal Q of the flip-flop circuit 29 is connected to the gate of the first switching element M11, the gate of the second switching element M12, and the gate of the fourth switching element M14 via the buffer BF1.

The clock signal CLK enters the set input terminal S of the flip-flop circuit 29. The flip-flop circuit 29 is set by rise or fall of the clock signal CLK to cause the output terminal Q to output a high-level voltage. The pulse signal Spw output from the PWM comparator 5 enters the reset input terminal R of the flip-flop circuit 29 via the inverter INV1. The flip-flop circuit 29, after being set, is reset by the pulse signal Spw output from the PWM comparator 5 to cause the output terminal Q to output a low-level voltage. A signal output from the output terminal Q of the flip-flop circuit 29 enters the gate of the first switching element M11, the gate of the second switching element M12, and the gate of the fourth switching element M14 via the buffer BF1. The reverse current detection circuit 6A operates as described above by referring to FIG. 4. Thus, the switching regulator 1AC of current mode control type may provide effects similar to those of the switching regulator 1A (depicted in FIG. 4) of voltage mode control type.

As illustrated in FIGS. 4 and 5, the third switching element M13 is provided at a position between the second switching element M12 and the output terminal OUT, and connects the second switching element M12 with the output terminal OUT. Alternatively, however, the third switching element M13 may be provided at a position between the junction Lx2 and the second switching element M12, and may connect the junction Lx2 with the second switching element M12.

As illustrated in FIGS. 2 and 3, the reverse current detection circuit 6 detects a symptom of a reverse current or a generation of a reverse current by comparing a voltage of the junction Lx1, which connects the first switching element M1 with the second switching element M2, with a ground voltage. As illustrated in FIGS. 4 and 5, the reverse current detection circuit 6A detects a symptom of a reverse current or a generation of a reverse current by comparing a voltage of the junction Lx2, which connects the inductor L1 with the first switching element M11, with an output voltage Vout. Thus, a time-lag between detection of generation of a reverse current and interruption of the reverse current may be shortened.

As illustrated in FIGS. 2 and 3, however, in the switching regulators 1 and 1C including the junction Lx1, a voltage of the junction Lx1 has a relatively large voltage amplitude equivalent to a power source voltage Vdd (e.g., an input voltage) resulting from the structure of the switching regulators 1 and 1C and switching operation between the second switching element M2 and the first switching element M1. When the second switching element M2 shifts from the off state to the on state, the comparator 11 included in the reverse current detection circuit 6 takes a long response time. For example, it takes a long time period to become ready for detecting a reverse current. Consequently, when a reverse current flows during the response time of the comparator 11, generation of the reverse current may not be detected. At the same time, providing another circuit to shorten the response time of the comparator 11 increases the circuit size of the switching regulators 1 and 1C.

To address this problem, circuits other than the inductor L1 and the condenser C1 may be integrated into a single integrated circuit. In this case, however, the junction Lx1 is connected as an external circuit, and accordingly, a signal output from the junction Lx1 may be susceptible to external noise, resulting in a malfunction of the reverse current detection circuit 6.

Figure 6:
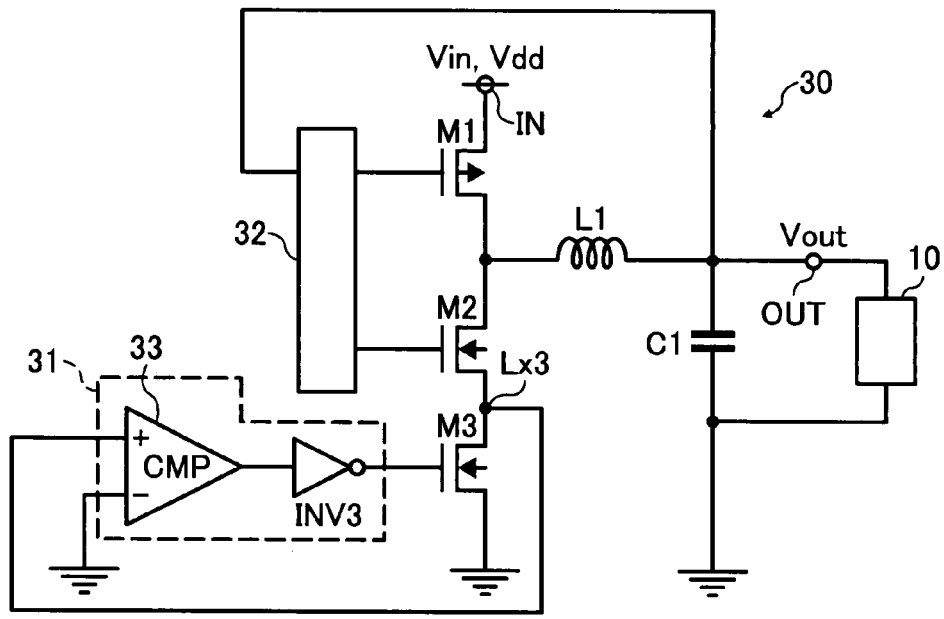
FIG. 6 is a circuit diagram of an example circuit of a switching regulator according to yet another exemplary embodiment of the present invention.

Referring to FIG. 6, a description is given of a switching regulator 30 according to yet another exemplary embodiment. The switching regulator 30 addresses the above-described problems by shortening the time-lag between detection of generation of a reverse current and interruption of the reverse current so as to reduce malfunctions of the reverse current detection circuit 6 (depicted in FIGS. 2 and 3).

As illustrated in FIG. 6, the switching regulator 30 includes a reverse current detection circuit 31, a control circuit unit 32, and a junction Lx3. The reverse current detection circuit 31 includes a comparator 33 and an inverter INV3. The reverse current detection circuit 31 replaces the reverse current detection circuit 6 (depicted in FIG. 2). The control circuit unit 32 includes the reference voltage generating circuit 2 and the error amplifier circuit 3 (depicted in FIG. 2). The junction Lx3 (e.g., a connecting portion) is provided at a position between the second switching element M2 and the third switching element M3, and connects the second switching element M2 with the third switching element M3. The other elements of the switching regulator 30 are common to the switching regulator 1 (depicted in FIG. 2). The comparator 33, the inverter INV3, and the third switching element M3 serve as a reverse current prevention circuit unit.

The switching regulator 30 is a synchronous rectification-type switching regulator for converting an input voltage Vin input to the input terminal IN into an output voltage Vout having a predetermined constant voltage and outputting the output voltage Vout from the output terminal OUT to the load 10.

As illustrated in FIGS. 2 and 3, in the reverse current detection circuit 6, the junction Lx1 connecting the first switching element M1 with the second switching element M2 is connected to the inverted input terminal of the comparator 11. However, in the reverse current detection circuit 31 illustrated in FIG. 6, the junction Lx3 connecting the second switching element M2 with the third switching element M3 is connected to a non-inverted input terminal of the comparator 33. An inverted input terminal of the comparator 33 is connected to a ground voltage. An output terminal of the comparator 33 is connected to a gate of the third switching element M3 via the inverter INV3.

In the above-described configuration, when a voltage of the junction Lx3 is smaller than the ground voltage and there is no symptom, sign, or possibility of generation of a reverse current which flows from the junction Lx3 to a ground voltage, the comparator 33 outputs a low-level signal to turn on the third switching element M3 and bring the third switching element M3 into conduction.

When a voltage of the junction Lx3 is equivalent to the ground voltage and a symptom of a reverse current is detected or when a voltage of the junction Lx3 exceeds the ground voltage and a generation of a reverse current is detected, the comparator 33 outputs a high-level signal. The inverter INV3 reverses the signal to turn off the third switching element M3 and interrupt the reverse current, while the second switching element M2 is turned on.

As described above, the reverse current detection circuit 31 detects whether or not there is a symptom of a reverse current flowing to the second switching element M2 based on the voltage of the junction Lx3. When the reverse current detection circuit 31 detects the symptom, the third switching element M3, which is connected to the second switching element M2 in series, is turned off to break connection between the second switching element M2 and the ground voltage. Thus, generation of the reverse current flowing to the second switching element M2 may be reliably prevented.

Providing a circuit separate from a control circuit system for the second switching element M2 interrupts the reverse current flowing to the second switching element M2, thus enabling a time-lag between detection of generation of a reverse current and interruption of the reverse current to be shortened, resulting in increased efficiency and easy and efficient design of the switching regulator 30.

Figure 7:
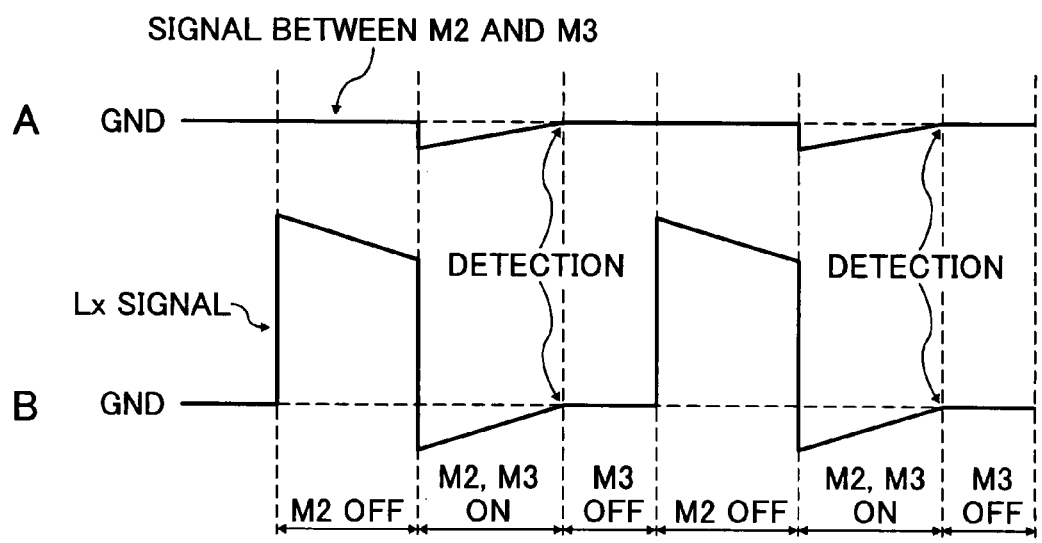
FIG. 7 is a graph illustrating change of voltage supplied to a comparator of the switching regulators shown in FIGS. 2 and 6.

Referring to FIG. 7, the following describes operations of the reverse current detection circuit 31 (depicted in FIG. 6). Section A of FIG. 7 illustrates change of voltage supplied to the comparator 33 (depicted in FIG. 6). Section B of FIG. 7 illustrates change of voltage supplied to the comparator 11 (depicted in FIGS. 2 and 3).

When the second switching element M2, which performs a switching operation in synchrony with the first switching element M1 (depicted in FIG. 6), shifts from the off state to the on state, that is, when there is no symptom, sign, or possibility of generation of a reverse current flowing from the junction Lx3 (depicted in FIG. 6) to the ground voltage, the comparator 33 (depicted in FIG. 6) compares a non-inverted input signal (e.g., a signal output from the junction Lx3) with an inverted input signal (e.g., a ground level signal). As a result, the comparator 33 outputs a low-level signal to turn on the third switching element M3. Thus, the reverse current detection circuit 31 becomes ready for detecting a reverse current. In this case, a voltage of the junction Lx3 is affected by a voltage decrease caused by a resistance generated when the third switching element M3 is turned on, and not by a voltage decrease caused by a resistance obtained by adding a resistance generated when the third switching element M3 is turned on to a resistance generated when the second switching element M2 is turned on. Thus, as illustrated in FIG. 7, a signal illustrated in section A of FIG. 7, which is output from the junction Lx3, has a smaller voltage level under the ground voltage than an Lx signal illustrated in section B of FIG. 7.

As illustrated in FIG. 6, the first switching element M1 and the second switching element M2 perform switching operations opposite from each other. Further, the junction Lx3 connects the second switching element M2 with the third switching element M3. Thus, a potential of the junction Lx3 does not increase to a level equivalent to a power source voltage Vdd (e.g., an input voltage). Specifically, the voltage of the junction Lx3 has a voltage amplitude illustrated in section A of FIG. 7 which is smaller than a voltage amplitude illustrated in section B of FIG. 7.

As a result, the comparator 33 may become ready for detecting a reverse current in a short response time period. For example, even when a reverse current flows immediately after the second switching element M2 is turned on, the reverse current detection circuit 31 may detect the reverse current. Thus, the switching regulator 30 may provide a shorter time-lag between detection of generation of a reverse current and interruption of the reverse current than the switching regulators 1 (depicted in FIG. 2), 1C (depicted in FIG. 3), 1A (depicted in FIG. 4), and 1AC (depicted in FIG. 5), resulting in increased efficiency of the switching regulator 30.

It should be noted that although FIG. 6 illustrates the switching regulator 30 of step-down type, the present invention is also applicable to a switching regulator of step-up type, as described below with reference to FIG. 8.

Figure 8:
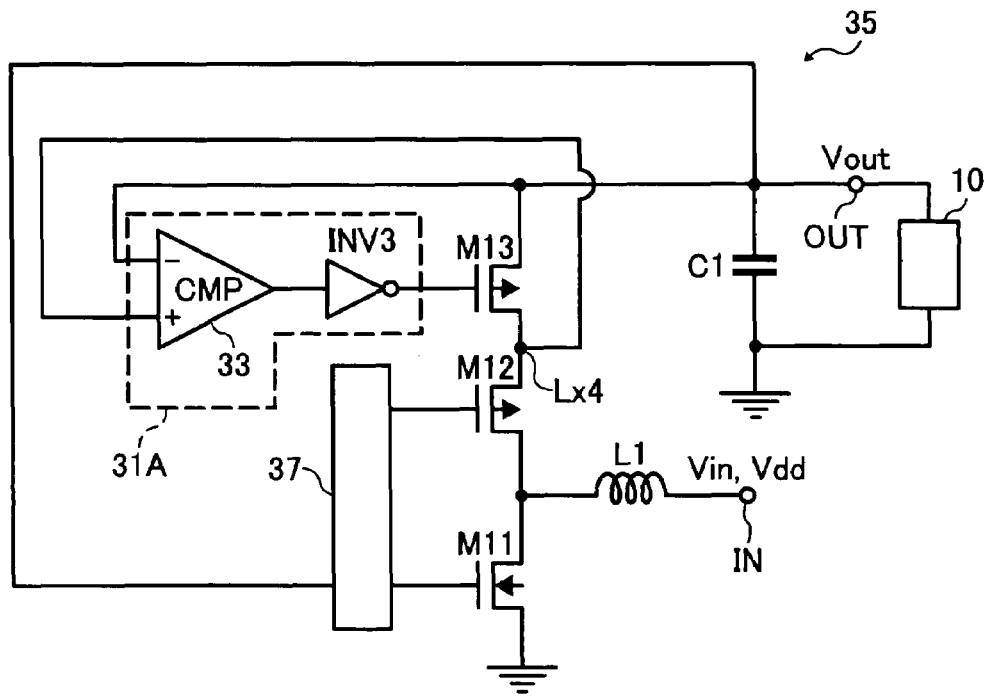
FIG. 8 is a circuit diagram of an example circuit of a switching regulator according to yet another and further exemplary embodiment of the present invention.

Referring to FIG. 8, the following describes a switching regulator 35 of step-up type according to yet another and further exemplary embodiment. As illustrated in FIG. 8, the switching regulator 35 includes a reverse current detection circuit 31A, a control circuit unit 37, and a junction Lx4. The reverse current detection circuit 31A includes the comparator 33 and the inverter INV3. The reverse current detection circuit 31A replaces the reverse current detection circuit 6A (depicted in FIG. 4). The control circuit unit 37 includes the reference voltage generating circuit 2 and the error amplifier circuit 3 (depicted in FIG. 4). The junction Lx4 (e.g., a connecting portion) connects the second switching element M12 with the third switching element M13. The other elements of the switching regulator 35 are common to the switching regulator 1A (depicted in FIG. 4). The comparator 33, the inverter INV3, and the third switching element M13 serve as a reverse current prevention circuit unit.

The switching regulator 35 is a synchronous rectification-type switching regulator for converting an input voltage Vin input to the input terminal IN into an output voltage Vout having a predetermined constant voltage and outputting the output voltage Vout from the output terminal OUT to the load 10.

One end of the inductor L1 is connected to the input terminal IN. The first switching element M11 connects another end of the inductor L1 to a ground voltage. The second switching element M12 connects a junction, which connects the first switching element M11 with the inductor L1, with the third switching element M13. One end of the third switching element M13 is connected to the output terminal OUT.

As illustrated in FIG. 4, in the reverse current detection circuit 6A, the junction Lx2 connecting the first switching element M11 with the inductor L1 is connected to the inverted input terminal of the comparator 11. However, in the reverse current detection circuit 31A illustrated in FIG. 8, the junction Lx4 connecting the second switching element M12 with the third switching element M13 is connected to the non-inverted input terminal of the comparator 33. The inverted input terminal of the comparator 33 is connected to the output terminal OUT. The output terminal of the comparator 33 is connected to a gate of the third switching element M13 via the inverter INV3.

In the above-described configuration, when a voltage of the junction Lx4 exceeds an output voltage Vout and there is no symptom of a reverse current which flows from the output terminal OUT to the junction Lx4, the comparator 33 outputs a high-level signal. The inverter INV3 reverses the signal to turn on the third switching element M13 and bring the third switching element M13 into conduction.

When a voltage of the junction Lx4 is equivalent to the output voltage Vout and the reverse current detection circuit 31A detects a symptom of a reverse current or when a voltage of the junction Lx4 is smaller than the output voltage Vout and the reverse current detection circuit 31A detects a generation of a reverse current, the comparator 33 outputs a low-level signal to turn off the third switching element M13 and interrupt the reverse current, while the second switching element M12 is turned on.

As described above, the reverse current detection circuit 31A detects whether or not there is a symptom of a reverse current flowing to the second switching element M12 based on the voltage of the junction Lx4. When the reverse current detection circuit 31A detects the symptom, the third switching element M13, which is connected to the second switching element M12 in series, is turned off to break connection between the second switching element M12 and the output terminal OUT. Thus, generation of the reverse current flowing to the second switching element M12 may be reliably prevented. In addition, providing a circuit separate from a control circuit system for the second switching element M12 interrupts the reverse current flowing to the second switching element M12, thus enabling a time-lag between detection of generation of a reverse current and interruption of the reverse current to be shortened, resulting in increased efficiency and easy and efficient design of the switching regulator 35.

In the switching regulator 35, as in the switching regulator 30 (depicted in FIG. 6), the voltage of the junction Lx4 connecting the second switching element M12 with the third switching element M13 is supplied to the non-inverted input terminal of the comparator 33. A signal output from the junction Lx4 has a small voltage level under the output voltage Vout and a small voltage amplitude. Thus, the comparator 33 may become ready for detecting a reverse current in a short response time period. For example, even when a reverse current flows immediately after the second switching element M12 is turned on, the reverse current detection circuit 31A may detect the reverse current.

In the switching regulator 30 (depicted in FIG. 6), for example, a voltage having a small voltage level under the ground voltage and a small voltage amplitude is supplied from the junction Lx3 connecting the second switching element M2 with the third switching element M3 to the non-inverted input terminal of the comparator 33. In general, there is variation in the comparate levels provided by the comparator due to errors occurring during manufacture. Consequently, when the voltage amplitude of a non-inverted input signal is only slightly under the ground voltage, a time difference between an actual detection of a reverse current and a desired detection of a reverse current may increase compared to a condition in which the voltage amplitude of a non-inverted input signal is large in the junction Lx3. Thus, when the reverse current detection circuit 31 detects a reverse current at a time earlier than the desired detection time of the reverse current, efficiency may decrease. By contrast, when the reverse current detection circuit 31 detects a reverse current at a time later than the desired detection time of the reverse current, the reverse current may not be reliably detected.

Figure 9:
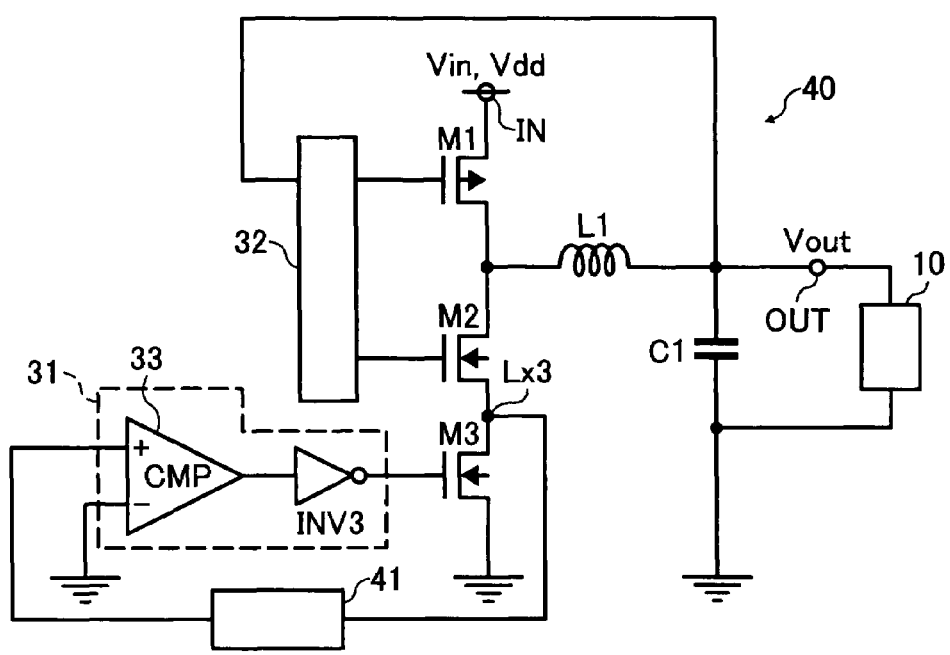
FIG. 9 is a circuit diagram of a modified circuit of the switching regulator shown in FIG. 6.

Referring to FIG. 9, the following describes a switching regulator 40 according to yet another exemplary embodiment. The switching regulator 40 is a modified version of the switching regulator 30 (depicted in FIG. 6) intended to address the above-described problems. As illustrated in FIG. 9, the switching regulator 40 includes an amplifier circuit 41. The other elements of the switching regulator 40 are common to the switching regulator 30 (depicted in FIG. 6).

The switching regulator 40 is a synchronous rectification-type switching regulator for converting an input voltage Vin input to the input terminal IN into an output voltage Vout having a predetermined constant voltage and outputting the output voltage Vout from the output terminal OUT to the load 10.

The amplifier circuit 41 is provided at a position between the junction Lx3 and the non-inverted input terminal of the comparator 33. The comparator 33, the inverter INV3, the third switching element M3, and the amplifier circuit 41 serve as a reverse current prevention circuit unit. The amplifier circuit 41 may be provided at a position between the junction Lx4 and the non-inverted input terminal of the comparator 33 in the switching regulator 35 depicted in FIG. 8.

The amplifier circuit 41 generates a signal by amplifying a voltage amplitude under a ground voltage and outputs the signal to the non-inverted input terminal of the comparator 33. Thus, the reverse current detection circuit 31 may detect a reverse current at a desired time, resulting in increased efficiency and reliable detection of a reverse current.

As described above, the switching regulators 30 (depicted in FIG. 6), 35 (depicted in FIG. 8), and 40 (depicted in FIG. 9) have a modified configuration of the switching regulators 1 (depicted in FIG. 2), 1C (depicted in FIG. 3), 1A (depicted in FIG. 4), and 1AC (depicted in FIG. 5). Therefore, an amplification amount of the amplifier circuit 41 is smaller than an amplitude of a voltage supplied to the inverted input terminal of the comparator 11 (depicted in FIGS. 2, 3, 4, and 5), and is equivalent to an amount capable of compensating for manufacturing error of the comparator 11 to increase efficiency and to reliably detect a reverse current.

In a switching regulator of synchronous rectification type (i.e., the switching regulators 30, 35, and 40 depicted in FIGS. 6, 8, and 9, respectively) according to the above-described exemplary embodiments, a reverse current prevention circuit unit detects a symptom of a reverse current or a generation of a reverse current flowing in a direction from an output terminal (i.e., the output terminal OUT depicted in FIGS. 6, 8, and 9) to a second switching element (i.e., the second switching element M2 depicted in FIGS. 6 and 9 and the second switching element M12 depicted in FIG. 8) based on a voltage of a junction (i.e., the junction Lx3 depicted in FIGS. 6 and 9 and the junction Lx4 depicted in FIG. 8) for connecting the second switching element with a third switching element (i.e., the third switching element M3 depicted in FIGS. 6 and 9 and the third switching element M13 depicted in FIG. 8). The voltage of the junction for connecting the second switching element with the third switching element has a small voltage amplitude. Therefore, the reverse current prevention circuit unit may detect a symptom of a reverse current or a generation of a reverse current within a decreased time period, with no extra circuit provided for shortening a time-lag between detection of generation of a reverse current and interruption of the reverse current. Specifically, the reverse current prevention circuit unit may shorten a time-lag between detection of generation of a reverse current and interruption of the reverse current, providing increased efficiency.

The voltage of the junction for connecting the second switching element with the third switching element has a small voltage amplitude. An amplifier circuit (i.e., the amplifier circuit 41 depicted in FIG. 9) amplifies the voltage to a level at which the reverse current prevention circuit unit may provide increased efficiency and reliable detection of a reverse current. Thus, the reverse current prevention circuit unit may provide improved control, increased efficiency, and reliable detection of a reverse current.

The second switching element and the third switching element may be integrated into a single integrated circuit, for example, together with a control circuit unit (i.e., the control circuit unit 32 depicted in FIGS. 6 and 8 and the control circuit unit 37 depicted in FIG. 8) and the reverse current prevention circuit unit. Therefore, the voltage of the junction for connecting the second switching element with the third switching element is not transmitted as an external output signal, thus preventing the reverse current prevention circuit unit from malfunctioning due to external noise.

The above-described exemplary embodiments may be applied to a switching regulator of synchronous rectification type, for example, to a switching regulator of synchronous rectification type providing increased efficiency when a small load is applied in an integrated circuit.

Although the present invention has been described above with reference to specific embodiments, the present invention is not limited to the details of the embodiments described above and various modifications and improvements are possible without departing from the spirit and scope of the invention. It is therefore to be understood that, within the scope of the appended claims, the present invention may be practiced otherwise than as specifically described herein. For example, elements and/or features of different illustrative embodiments may be combined with each other and/or substituted for each other within the scope of the present invention and appended claims.

What is claimed is:

1. A synchronous rectification switching regulator, comprising:

an input terminal configured to receive an input voltage;

an output terminal configured to output a predetermined output voltage obtained by converting the input voltage;

a load connected to the output terminal and configured to receive the predetermined output voltage output by the output terminal;

a first switching element configured to perform a first switching;

an inductor charged with the input voltage by the first switching of the first switching element;

a second switching element for synchronous rectification configured to perform a second switching to discharge the inductor;

a control circuit unit configured to control the first switching element to perform the first switching and to control the second switching element to perform the second switching opposite to the first switching, causing the output terminal to output the predetermined output voltage;

a reverse current prevention circuit unit including a third switching element connected to the second switching element in series; and a connecting portion configured to connect the second switching element with the third switching element, wherein the reverse current prevention circuit unit detects one of a symptom of a reverse current flowing in a direction from the output terminal to the second switching element and a generation of the reverse current based on a voltage of the connecting portion, and wherein the reverse current prevention circuit unit turns off the third switching element to interrupt the reverse current when the reverse current prevention circuit unit detects the symptom or the generation of the reverse current.

2. The synchronous rectification switching regulator according to claim 1, wherein:

the reverse current prevention circuit unit further includes an amplifier circuit configured to amplify the voltage of the connecting portion; and the reverse current prevention circuit unit detects one of the symptom and the generation of the reverse current based on the amplified voltage.

3. The synchronous rectification switching regulator according to claim 1, further comprising a step-down switching regulator in which the inductor connects one end of the first switching element with the output terminal, and the second switching element connects the first switching element with the third switching element including one end connected to a ground voltage, wherein the first switching element performs switching in accordance with a control signal to control output of the input voltage and the reverse current prevention circuit unit turns off the third switching element when the voltage of the connecting portion is not smaller than the ground voltage.

4. A synchronous rectification switching regulator, comprising:
an input terminal configured to receive an input voltage;
an output terminal configured to output a predetermined output voltage obtained by converting the input voltage;
a load connected to the output terminal and configured to receive the predetermined output voltage output by the output terminal;
a first switching element configured to perform a first switching;
an inductor charged with the input voltage;
a second switching element for synchronous rectification configured to perform a second switching to discharge the inductor;
a control circuit unit configured to control the first switching element to perform the first switching and to control the second switching element to perform the second switching opposite to the first switching, causing the output terminal to output the predetermined output voltage;
a reverse current prevention circuit unit including a third switching element connected to the second switching element in series; and
a connecting portion configured to connect the second switching element with the third switching element,
wherein the reverse current prevention circuit unit detects one of a symptom of a reverse current flowing in a direction from the output terminal to the second switching element and a generation of the reverse current based on a voltage of the connecting portion, and
wherein the reverse current prevention circuit unit turns off the third switching element to interrupt the reverse current when the reverse current prevention circuit unit detects the symptom or the generation of the reverse current.

5. The synchronous rectification switching regulator according to claim 4, further comprising a step-up switching regulator in which one end of the inductor is connected to the input terminal,
wherein the first switching element connects another end of the inductor to a ground voltage and the second switching element connects a junction, which connects the first switching element with the inductor, with the third switching element including one end connected to the output terminal,
the reverse current prevention circuit unit turning off the third switching element when the voltage of the connecting portion is not greater than a voltage of the output terminal.

6. A switching method, comprising:
inputting an input voltage to an input terminal;
connecting the input terminal with a load via an inductor and an output terminal;
charging the inductor with the input voltage;
connecting a second switching element with a third switching element in series via a connecting portion;
detecting one of a symptom of a reverse current flowing in a direction from the output terminal to the second switching element and a generation of the reverse current based on a voltage of the connecting portion;
turning off the third switching element to interrupt the reverse current when the symptom or the generation of the reverse current is detected;
discharging the inductor by switching of the second switching element; and
outputting a predetermined output voltage to the load.

7. The switching method according to claim 6, wherein the inductor is charged with the input voltage by switching of a first switching element.

8. The switching method according to claim 7, further comprising amplifying the voltage of the connecting portion to detect one of the symptom and the generation of the reverse current based on the amplified voltage.

9. The switching method according to claim 7, further comprising:
connecting one end of the first switching element with the output terminal;
connecting the first switching element with the third switching element including one end connected to a ground voltage, via the second switching element;
causing the first switching element to perform switching in accordance with a control signal to control output of the input voltage; and
turning off the third switching element when the voltage of the connecting portion is not smaller than the ground voltage.

10. The switching method according to claim 6, further comprising:
connecting one end of the inductor to the input terminal;
connecting another end of the inductor to a ground voltage via the first switching element;
connecting a junction, which connects the first switching element with the inductor, with the third switching element including one end connected to the output terminal, via the second switching element; and
turning off the third switching element when the voltage of the connecting portion is not greater than a voltage of the output terminal.

\* \* \* \* \*